United States Patent
Chou et al.

(10) Patent No.: US 9,772,664 B1
(45) Date of Patent: Sep. 26, 2017

(54) MEMORY HEATER AND HEATING AID ARRANGEMENT

(71) Applicant: ADLINK TECHNOLOGY INC., New Taipei (TW)

(72) Inventors: Chun-Hung Chou, New Taipei (TW); Chih-Liang Fang, New Taipei (TW)

(73) Assignee: ADLINK TECHNOLOGY INC., New Taipei (TW)

( * ) Notice: Subject to any disclaimer, the term of this patent is extended or adjusted under 35 U.S.C. 154(b) by 0 days.

(21) Appl. No.: 15/081,436

(22) Filed: Mar. 25, 2016

(51) Int. Cl.
| H05B 3/26 | (2006.01) |
| G06F 1/20 | (2006.01) |
| H05K 1/18 | (2006.01) |
| H05K 1/02 | (2006.01) |
| G06F 1/18 | (2006.01) |

(52) U.S. Cl.
CPC .............. *G06F 1/206* (2013.01); *G06F 1/183* (2013.01); *H05B 3/26* (2013.01); *H05K 1/0203* (2013.01); *H05K 1/181* (2013.01); *H05K 2201/10159* (2013.01); *H05K 2201/10409* (2013.01)

(58) Field of Classification Search
None
See application file for complete search history.

(56) References Cited

U.S. PATENT DOCUMENTS

| 5,010,233 A * | 4/1991 | Henschen | B23K 3/0475 219/209 |
| 6,054,676 A * | 4/2000 | Wall | H01L 23/345 165/104.33 |
| 6,114,674 A * | 9/2000 | Baugh | H01C 13/00 174/250 |
| 6,243,268 B1 * | 6/2001 | Kang | H01L 23/473 165/104.21 |
| 6,246,581 B1 * | 6/2001 | Kang | H01L 23/345 165/104.21 |
| 7,042,723 B2 * | 5/2006 | Espersen | H01L 23/10 165/80.4 |
| 7,282,393 B2 * | 10/2007 | Tarn | B81C 1/00269 257/E23.081 |
| 7,286,355 B2 * | 10/2007 | Cheon | G06F 1/20 165/104.33 |
| 7,335,855 B2 * | 2/2008 | von der Luhe | H01C 1/014 219/201 |

(Continued)

*Primary Examiner* — Xanthia C Cunningham
(74) *Attorney, Agent, or Firm* — Muncy, Geissler, Olds & Lowe, P.C.

(57) ABSTRACT

A memory heater and heating air arrangement includes circuit module including circuit board, a plurality of memory modules mounted at the circuit board, memory heat sink wrapped around each memory module and locating member mounted at the circuit board around the memory modules, heating aid including flat heat-transfer base panel bonded to top side of the memory heat sinks, mounting structure located at the border of the flat heat-transfer panel and affixed to the locating member to secure the heating aid to the circuit module, and a heater attached to a top surface of the flat heat-transfer base panel of the heating aid and controllable by the circuit module to emit heat to the memory modules via the heating aid, enabling the memory modules to work under a cold environment. Subject to the functioning of the heating aid, one single heater is sufficient to heat the memories, saving the cost.

7 Claims, 5 Drawing Sheets

(56) References Cited

U.S. PATENT DOCUMENTS

| | | | | |
|---|---|---|---|---|
| 7,480,147 B2* | 1/2009 | Hoss | G06F 1/20 | 361/715 |
| 7,715,197 B2* | 5/2010 | Tian | H01L 23/367 | 165/185 |
| 8,542,488 B2* | 9/2013 | Peterson | G06F 1/20 | 361/679.47 |
| 8,614,499 B2* | 12/2013 | Smythe | G11C 13/0004 | 257/536 |
| 8,625,275 B2* | 1/2014 | Lin | H01L 23/4093 | 165/185 |
| 9,111,924 B2* | 8/2015 | Aliane | H01L 23/345 | |
| 9,405,338 B2* | 8/2016 | Demange | G06F 1/20 | |
| 2002/0057884 A1* | 5/2002 | Hirose | G02B 6/30 | 385/137 |
| 2005/0152119 A1* | 7/2005 | Lee | H01L 23/4093 | 361/710 |
| 2006/0056154 A1* | 3/2006 | Foster, Sr. | G06F 1/185 | 361/700 |
| 2006/0056788 A1* | 3/2006 | Williamson | G02B 6/4238 | 385/137 |
| 2006/0163629 A1* | 7/2006 | Nickel | G11C 11/16 | 257/295 |
| 2007/0263353 A1* | 11/2007 | McGuff | G06F 1/185 | 361/688 |
| 2008/0174965 A1* | 7/2008 | Hsu | H05K 7/2049 | 361/704 |
| 2008/0251911 A1* | 10/2008 | Farnsworth | H01L 23/4093 | 257/714 |
| 2009/0109613 A1* | 4/2009 | Legen | G06F 1/20 | 361/679.54 |
| 2009/0166065 A1* | 7/2009 | Clayton | H05K 1/189 | 174/254 |
| 2009/0277616 A1* | 11/2009 | Cipolla | F28D 15/0233 | 165/104.33 |
| 2009/0290301 A1* | 11/2009 | Legen | H01L 23/3672 | 361/679.54 |
| 2009/0303679 A1* | 12/2009 | Chen | G06F 1/20 | 361/679.49 |
| 2009/0316352 A1* | 12/2009 | Zhu | G11C 5/04 | 361/679.54 |
| 2010/0085712 A1* | 4/2010 | Hrehor, Jr. | H05K 7/20254 | 361/699 |
| 2010/0188817 A1* | 7/2010 | Chou | H01L 23/467 | 361/697 |
| 2010/0302732 A1* | 12/2010 | Chou | H01L 23/40 | 361/697 |
| 2012/0120605 A1* | 5/2012 | Arvelo | H05K 7/20772 | 361/702 |
| 2013/0094148 A1* | 4/2013 | Sloane | H05K 1/0212 | 361/708 |
| 2013/0182389 A1* | 7/2013 | Demange | G06F 1/20 | 361/679.54 |
| 2014/0027435 A1* | 1/2014 | Chou | H05B 1/02 | 219/209 |
| 2016/0081197 A1* | 3/2016 | Arvelo | H01L 23/34 | 29/832 |

* cited by examiner

MEMORY HEATER AND HEATING AID ARRANGEMENT

BACKGROUND OF THE INVENTION

1. Field of the Invention

The present invention relates to computer memory heating technology and more particularly, to a memory heater and heating air arrangement, which uses a heating aid for transferring heat energy from one single heater to multiple memory modules, allowing the memory modules to work normally under a cold environment.

2. Description of the Related Art

Following fast development of computer technology, advanced computers with high computing capabilities and fast operating speed have been continuously created. With the trend of the development of computer technology toward high operating speed and high frequency, computer internal components and memories for these advanced computers will generate a large amount of heat during operation. The memory bandwidth has been extended from the early PC100 of 800 MB/s to the modern DDR500 of 4.0 GB/s, or even the multi-channel platform. Thus, the bandwidth has been increased more than twice. Either the working clock or transmission bandwidth is obviously developing toward high-speed and high-frequency applications to match the high-speed computing of the central processor of the motherboard.

However, if a computer is operated outdoors under climate extremes, high humidity and intense sunshine environments, it will be a very stringent test. When using a computer in the day under a very large diurnal temperature environment (such as desert), computer internal heat dissipation device and fan can dissipate latent heat, maintaining normal memory functioning, however, when using a computer at night under low temperature or very cold outdoor environments (such as snow land), the memory in the computer will not be normally started up due to the temperature is too low.

Further, computer memories can simply work under the temperature environment above 0° C. For enabling computer memories to work normally under extremely low temperature (below 0° C.) environment, it is the normal way to attach two heaters to opposing left and right sides of the memories in the computer. When the environmental temperature is below 0° C., the heaters are started up to generate heat, increasing the temperature of the memories up to the normal operating temperature range.

However, because the motherboard for an advanced computer has multiple communication slots for the mounting of multiple memories, according to the conventional memory heating techniques, it needs to install a large amount of heaters in the motherboard for heating multiple memories, complicating heater installation procedure and leading to a high defective rate.

Therefore, how to solve the drawbacks and inconvenience of the aforesaid conventional techniques is the direction of improvement the related industries need to achieve.

SUMMARY OF THE INVENTION

The present invention has been accomplished under the circumstances in view. It is therefore one object of the present invention to provide a memory heater and heating aid arrangement, which comprises a circuit module, which comprises a circuit board, a plurality of memory modules mounted at the circuit board, a memory heat sink wrapped around each memory module and a locating member mounted at the circuit board around the memory modules, a heating aid, which comprises a flat heat-transfer base panel bonded to a top side of the memory heat sinks, a mounting structure located at the border of the flat heat-transfer panel and affixed to the locating member to secure the heating aid to the circuit module, and a heater, which is attached to the top surface of the flat heat-transfer base panel of the heating aid and controllable by the circuit module to emit heat. Thus, the heater can emit heat through the heating aid to heat the memory heat sink and the memories, enabling the memories to work under a cold environment.

It is another object of the present invention to provide a memory heater and heating aid arrangement, which utilizes the heating air to transfer heat energy from the heater to the memory modules for heating the memories, enabling the memories to work under a cold environment. Subject to the functioning of the heating aid, one single heater is sufficient to heat the memories, saving the cost.

It is still another object of the present invention to provide a memory heater and heating aid arrangement, which enables the heater to be bonded to the top surface of the flat heat-transfer base panel of the heating aid, the planar heat spreader to be closely set between the rows of memory heat sinks of the circuit module and the heating aid, and the mounting structure of the heating aid to be affixed to the locating member of the circuit module, facilitating installation and minimizing installation cost.

It is still another object of the present invention to provide a memory heater and heating aid arrangement, which provides a thermal insulation material bonded to the top surface of the heater to prohibit upward transfer of heat that is generated by the heater so that the heater can heat the memories of the memory modules efficiently.

Other advantages and features of the present invention will be fully understood by reference to the following specification in conjunction with the accompanying drawings, in which like reference signs denote like components of structure.

DETAILED DESCRIPTION OF THE PREFERRED EMBODIMENT

Figure 1:
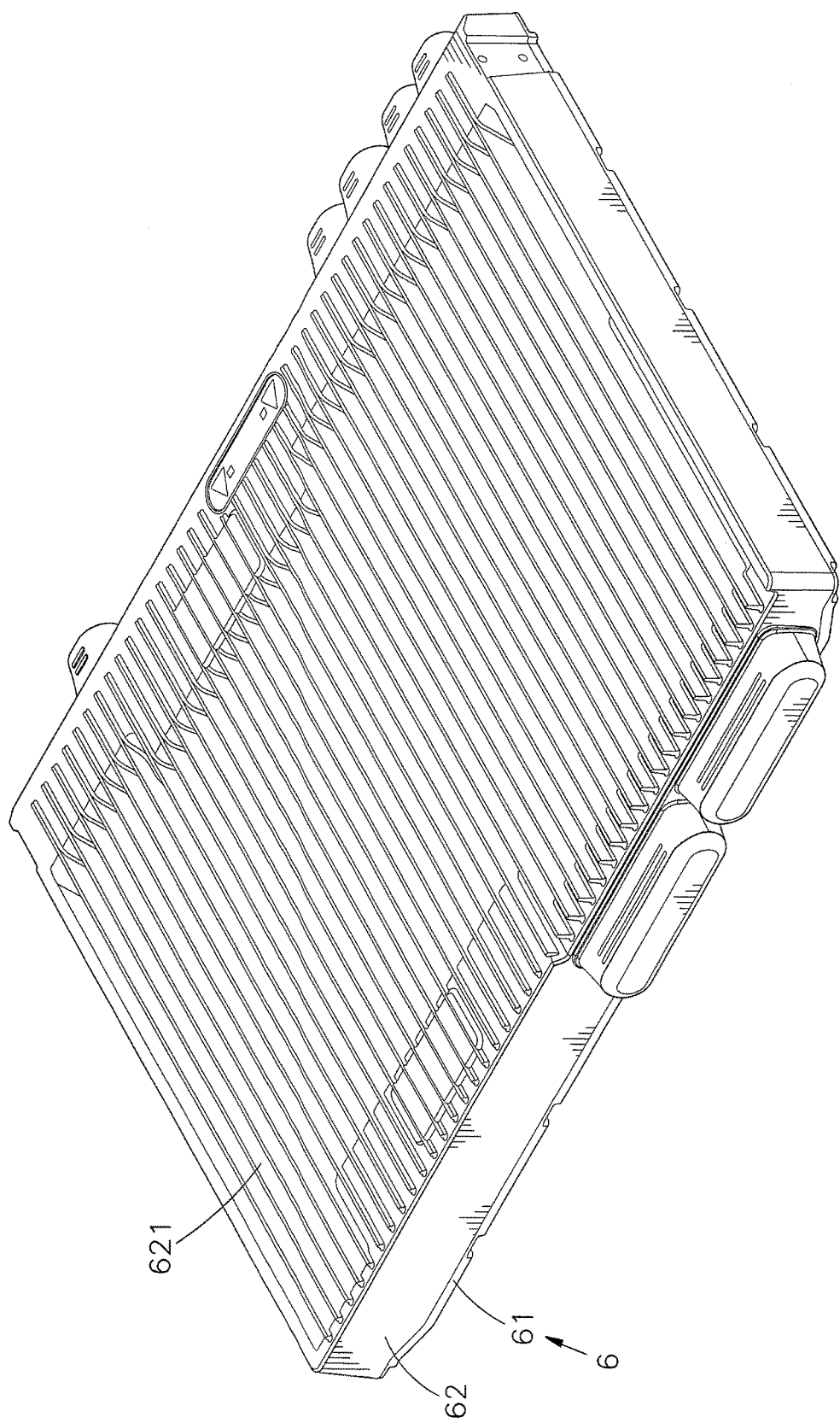
FIG. 1 is an oblique top elevational view of a memory heater and heating aid arrangement in accordance with the present invention.
Figure 2:
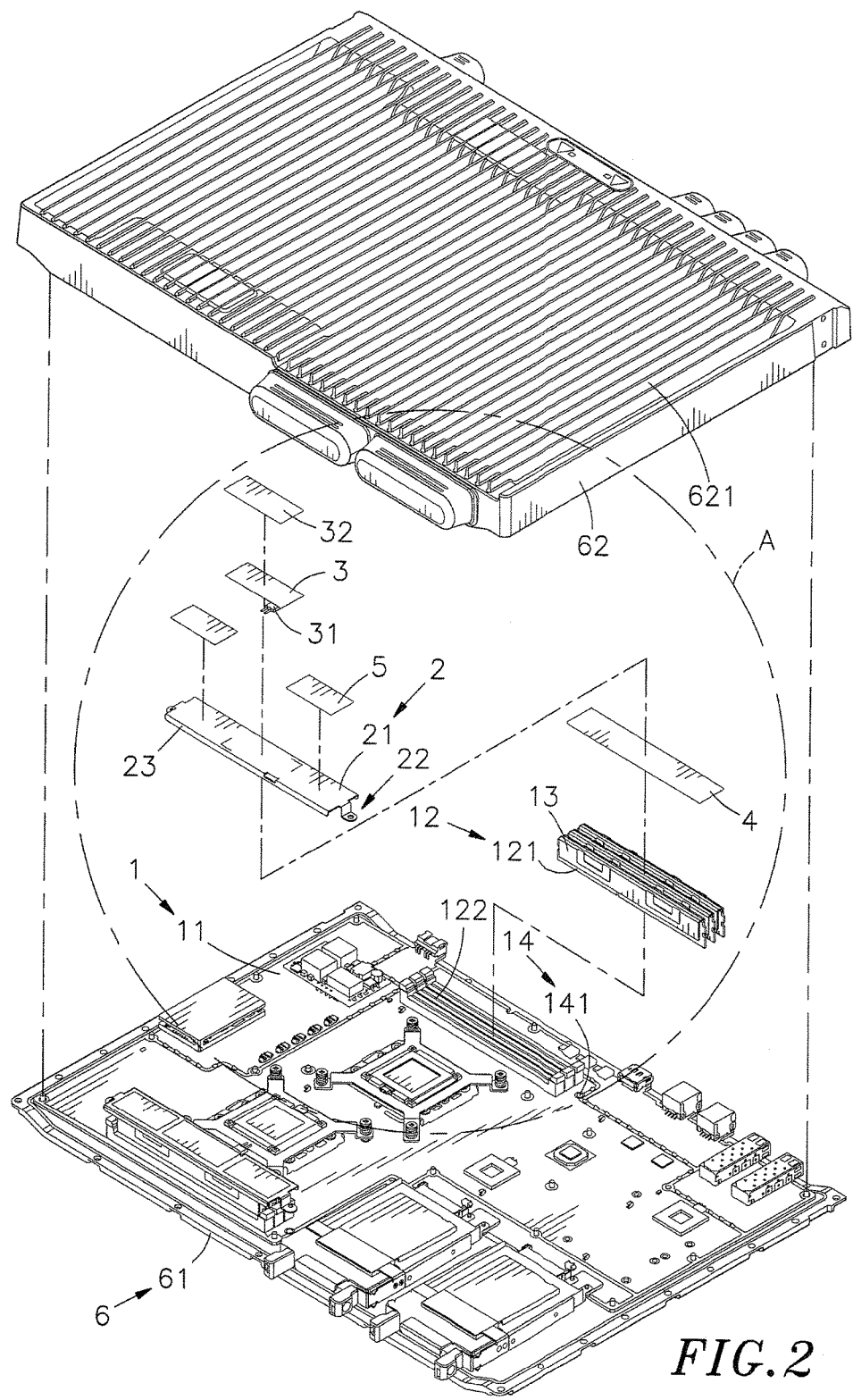
FIG. 2 is an exploded view of the memory heater and heating aid arrangement in accordance with the present invention.
Figure 3:
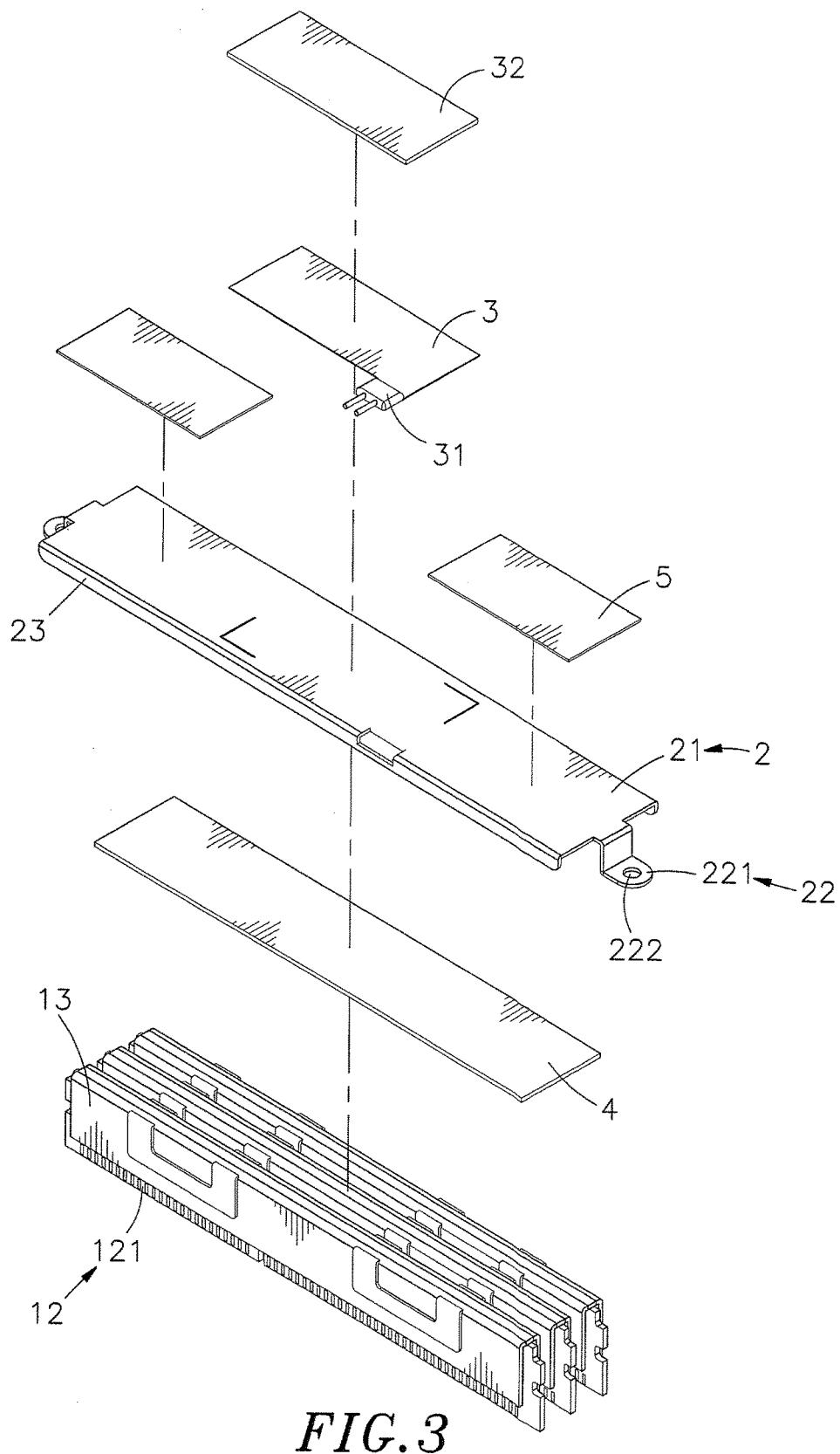
FIG. 3 is an enlarged view of Part A of FIG. 2.
Figure 4:
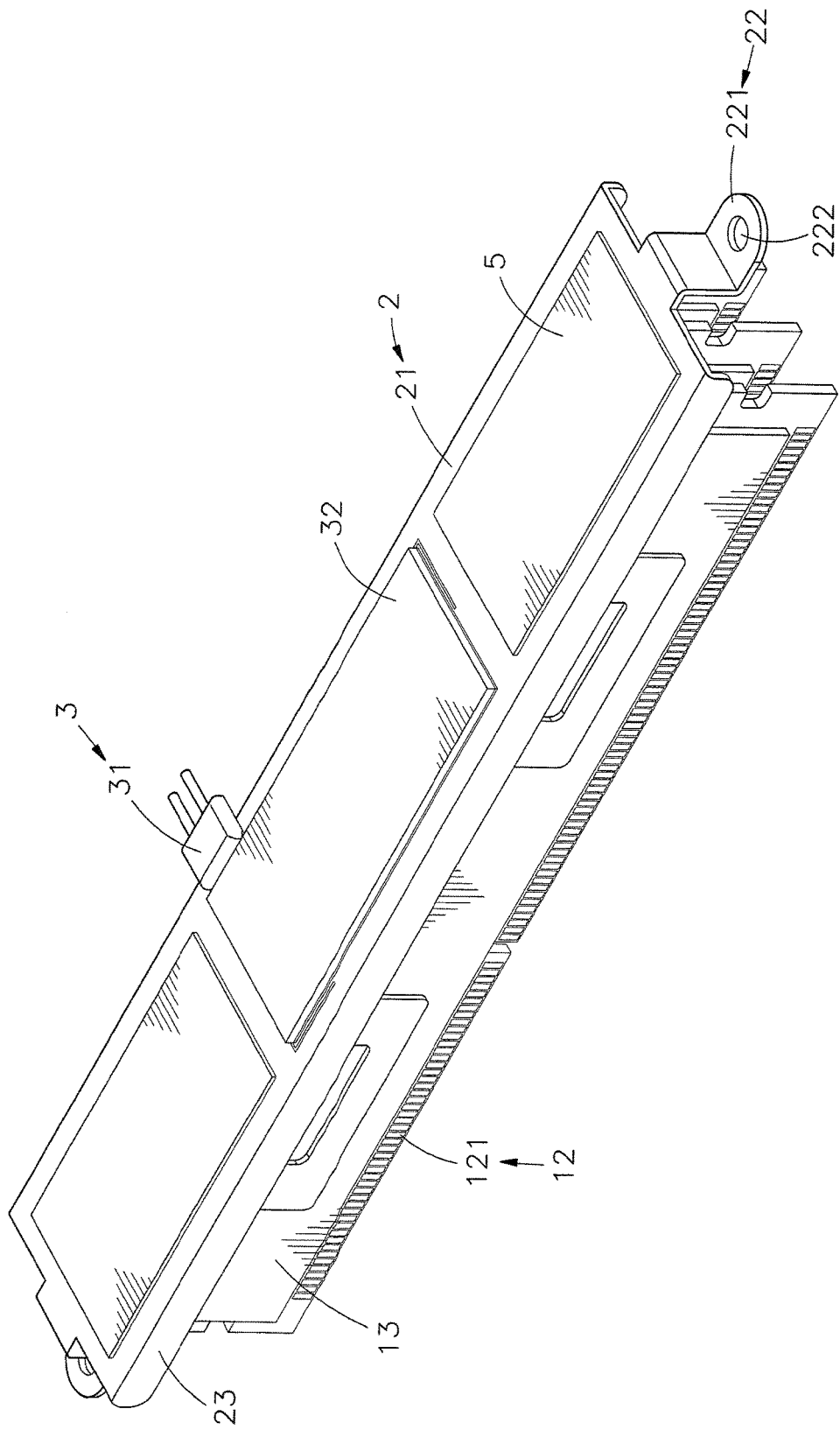
FIG. 4 is an oblique top elevation illustrating the component parts of FIG. 3 assembled.
Figure 5:
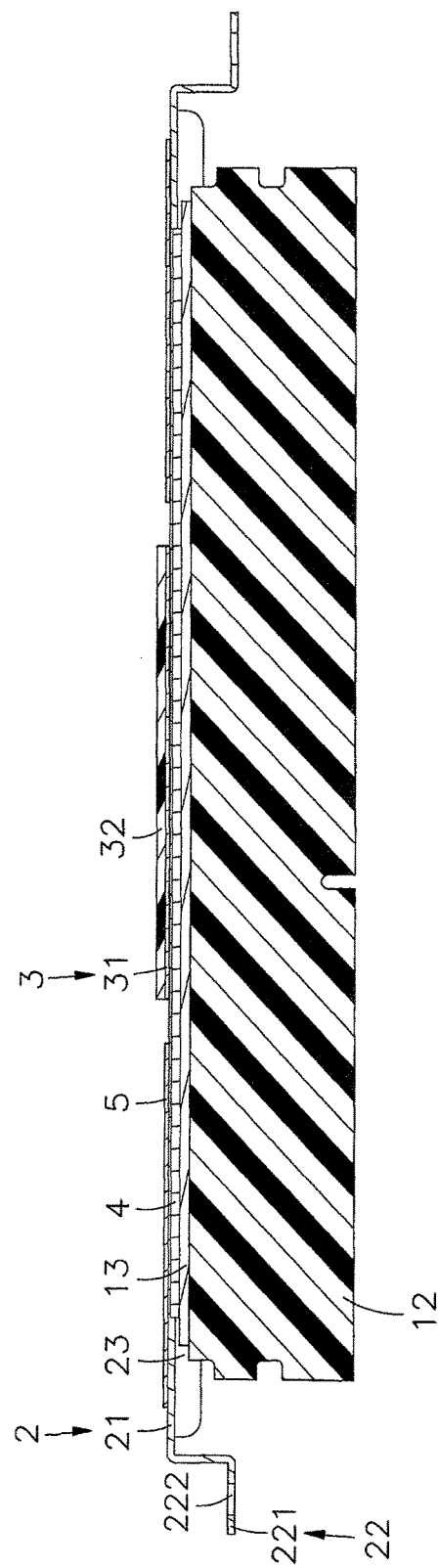
FIG. 5 is a sectional side view of FIG. 4.

Referring to FIGS. 1-5, a memory heater and heating aid arrangement in accordance with the present invention is shown. As illustrated, the memory heater and heating aid arrangement generally comprises a circuit module 1, a heating aid 2 and a heater 3.

The circuit module 1 comprises a circuit board 11, a plurality of a plurality of memory modules 12 installed in the circuit board 11, each memory module 12 comprising a memory 121 and a communication slot 122 for the connection of the memory 121 electrically, a memory heat sink 13 wrapped around the memory 121 of each memory module 12, and a locating member 14 affixed to the circuit board 11 around the memory modules 12 and providing a plurality of screw holes 141.

The heating aid 2 comprises a flat heat-transfer base panel 21, a mounting structure 22 comprising a plurality of zigzag mounting lugs 221 respectively extended from two opposite ends of the flat heat-transfer base panel 21 and a mounting through hole 222 at each zigzag mounting lug 221, and two stop flanges 23 respectively perpendicularly extended from two opposite lateral sides of the flat heat-transfer base panel 21 between the zigzag mounting lugs 221.

The heater 3 comprises a plurality of power leads 31 located at one side thereof, and a thermal insulation material 32 bonded to a top surface thereof.

Further, a planar heat spreader 4 is set between the rows of memory heat sinks 13 and the heating aid 2. Further, two heat dissipation devices 5 are bonded to a top surface of the flat heat-transfer base panel 21 of the heating aid 2 at two opposite sides.

The heater 3 can be obtained from different manufacturers and made subject to different specifications in any of a variety of shapes and sizes. Alternatively, the heater 3 can be made in a particular shape and size subject to actual requirements or application. With respect to the technique for the fabrication of the heater 31 and the technique for conducting the power leads 31 to generate heat, these techniques are well know and not within the scope of the spirit of the present invention, no further detailed description in this regard will be given.

Further, the thermal insulation material 32 of the heater 3 can be selected from the group of rubber, silicone rubber, plastic materials such as Mylar polyester (polyethylene terephthalate), foam, glass fiber or carbon fiber, mica flake, alumina ceramic sheet, or any other heat-resistant and electrical insulating materials.

In installation, wrap one respective memory heat sink 13 around the memory 121 of each memory module 12, and then bond the planar heat spreader 4 to the rows of memory heat sinks 13, and then stack the heating aid 2 on the top surface of the planar heat spreader 4 to keep the flat heat-transfer base panel 21 in close contact with the top surface of the planar heat spreader 4 and to have the zigzag mounting lugs 221 and stop flanges 23 be abutted against the border edges of the planar heat spreader 4 and the peripheral edges of the rows of memory heat sinks 13, prohibiting the planar heat spreader 4 from falling out of the memory heat sinks 13 and the heating aid 2. Thereafter, insert screws (not shown) through the mounting through holes 222 of the mounting structure 22 and drive the screws into the respective screw holes 141 at the locating member 14 using a hand tool (not shown) to affix the heating aid 2 to the locating member 14 and circuit board 11 of the circuit module 1, and then attach the heater 3 to the top surface of the flat heat-transfer base panel 21 of the heating aid 2 between the two heat dissipation device 5, and then bond the thermal insulation material 32 to the top surface of the heater 3, and then mount the assembly of the circuit module 1, heating aid 2 and heater 3 in a bottom shell 61 of a housing 6 of a computer device (not shown), and then affix a top cover shell 62 of the housing 6 to the bottom shell 61 to keep the heat dissipation devices 5 and the thermal insulation material 32 in contact with radiation fins 621 of the top cover shell 62, and thus, the installation of the memory heater and heating aid arrangement is done.

If the temperature detected by the sensing circuit or temperature sensor (not shown) of the circuit board 11 of the circuit module 1 goes below 0° C., the circuit module 1 immediately conducts the power leads 31, causing the heater 3 to generate heat, enabling generated heat to be transferred to the heating aid 2 and then the memory heat sinks 13 via the planar heat spreader 4, and thus, the memories 121 of the memory modules 12 are heated by the memory heat sinks 13 to the normal operating temperature level (for example, ranging from 0° C.~+75° C.). As soon as the temperature of the memories 121 reaches the normal operating temperature level (0° C.~+75° C.) and the temperature detected by the sensing circuit or temperature sensor (not shown) of the circuit board 11 of the circuit module 1 goes above 0° C., the circuit module 1 immediately cuts off power supply from the power leads 31 to turn off the heater 3, thus, the computer equipment (computer, notebook computer, etc.) carrying the memory heater and heating aid arrangement therein can be operated normally under low temperature or cold outdoor environments, preventing computer equipment shut-down due to low temperature.

Further, the invention simply needs to use one single heater 3 to heat the memory modules 12 via the heating aid 2, enabling the memories 121 of the memory modules 12 to work normally under low temperature or very cold outdoor environments. Subject to the functioning of the heating aid 2, one single heater 3 is sufficient for heating the memories 121 to the normal operating temperature range, saving the cost.

As stated above, the memory heat sinks 13 are respectively wrapped around the respective memories 121, the planar heat spreader 4 is set between the rows of memory heat sinks 13 and the heating aid 2, the two heat dissipation devices 5 are bonded to a top surface of the flat heat-transfer base panel 21 of the heating aid 2 at two opposite sides and kept in direct contact with the radiation fins 621 of the top cover shell 62 of the housing 6 that houses the memory heater and heating aid arrangement. Thus, during operation of the memories 121 of the circuit module 1, latent heat can be rapidly transferred from the memories 121 to the heating aid 2, the heat dissipation devices 5 and the radiation fins 621 of the top cover shell 62 of the housing 6 for quick dissipation, enhancing the heat dissipation efficiency of the computer device.

Further, in installation, the heater 3 can be bonded to the flat heat-transfer base panel 21 of the heating aid 2, and then bond the planar heat spreader 4 to the top side of the memory heat sinks 13 of the circuit module 1, and then bond the heating aid 2 with the bonded heater 3 to the top surface of the planar heat spreader 4 to keep the mounting through holes 222 of the heating aid 2 in alignment with the respective screw holes 141 of the circuit module 1, and then affix the heating aid 2 to the circuit module 1 by screws, simplifying the installation and saving the installation cost.

Further, the thermal insulation material 32 that is bonded to the top surface of the heater 3 has heat resistance and electrical resistance characteristics. During operation of the heater 3 to generate heat, the thermal insulation material 32 prevents transfer of heat energy from the heater 3 to the top cover shell 62 of the housing 6, enhancing the performance of the heater 3 to heat the memory modules 12.

In conclusion, the invention provides a memory heater and heating air arrangement, which comprises a circuit module 1 comprising a circuit board 11, a plurality of memory modules 12 arranged on the circuit board 11 and memory heat sinks 13 respectively wrapped around the memory modules 12, a heating aid 2, which comprises a flat heat-transfer base panel 21 bonded to the top side of the memory heat sinks 13, and a heater 3 mounted at the top surface of the flat heat-transfer base panel 21 and controllable to generate heat for heating the memory modules 12 via the heating aid 2 and the memory heat sinks 13 when the computer device using the memory heater and heating air arrangement works under a cold environment.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A memory heater and heating aid arrangement, comprising
   a circuit module comprising a circuit board, a plurality of memory modules mounted at said circuit board, a memory heat sink wrapped around each said memory module, and a locating member mounted at said circuit board around said memory modules;
   a heating aid comprising a flat heat-transfer base panel bonded to a top side of said memory heat sinks, a mounting structure located at the border of said flat heat-transfer panel and affixed to said locating member to secure said heating aid to said circuit module; and
   a heater attached to a top surface of said flat heat-transfer base panel of said heating aid.

2. The memory heater and heating aid arrangement as claimed in claim 1, wherein each said memory module of said circuit module comprises a communication slot electrically connected to said circuit board, and a memory inserted into said communication slot and electrically connected to said circuit board by said communication slot.

3. The memory heater and heating aid arrangement as claimed in claim 1, wherein said locating member of said circuit module comprises a plurality of screw holes; said mounting structure of said heating aid comprises two zigzag mounting lugs respectively extended from two opposite ends of said flat heat-transfer base panel, and a plurality of mounting through holes respectively located at said zigzag mounting lugs and fixedly fastened to said screw holes of said locating member by respective screws.

4. The memory heater and heating aid arrangement as claimed in claim 1, wherein said heating aid further comprises two stop flanges respectively perpendicularly extended from two opposite lateral sides of said flat heat-transfer base panel.

5. The memory heater and heating aid arrangement as claimed in claim 1, further comprising a planar heat spreader set between said memory heat sinks and said heating aid.

6. The memory heater and heating aid arrangement as claimed in claim 1, further comprising two heat dissipation devices bonded to a top surface of said flat heat-transfer base panel of said heating aid at two opposite sides.

7. The memory heater and heating aid arrangement as claimed in claim 1, wherein said heater comprises a plurality of power leads located at one side thereof for connection to a power source, and a thermal insulation material bonded to a top surface thereof to prohibit upward transfer of generated heat.

\* \* \* \* \*